United States Patent
Hoang et al.

(10) Patent No.: US 10,254,324 B2
(45) Date of Patent: *Apr. 9, 2019

(54) DEVICE FOR ELECTRIC AND MAGNETIC MEASUREMENTS

(71) Applicant: SKYWORKS SOLUTIONS, INC., Woburn, MA (US)

(72) Inventors: Dinhphuoc Vu Hoang, Anaheim, CA (US); Guohao Zhang, Nanjing (CN)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/056,399

(22) Filed: Aug. 6, 2018

(65) Prior Publication Data
US 2019/0041442 A1 Feb. 7, 2019

Related U.S. Application Data

(63) Continuation of application No. 14/020,796, filed on Sep. 7, 2013, now Pat. No. 10,041,987.

(60) Provisional application No. 61/698,615, filed on Sep. 8, 2012, provisional application No. 61/698,617, filed on Sep. 8, 2012.

(51) Int. Cl.
| | |
|---|---|
| *G01R 29/10* | (2006.01) |
| *G01R 29/08* | (2006.01) |
| *G01R 31/00* | (2006.01) |
| *G01R 1/07* | (2006.01) |
| *G01R 27/32* | (2006.01) |
| *G01R 27/04* | (2006.01) |
| *G01R 27/02* | (2006.01) |

(52) U.S. Cl.
CPC .......... *G01R 29/0878* (2013.01); *G01R 1/07* (2013.01); *G01R 27/32* (2013.01); *G01R 29/0821* (2013.01); *G01R 29/0871* (2013.01); *G01R 29/10* (2013.01); *G01R 31/001* (2013.01); *G01R 31/002* (2013.01); *G01R 27/02* (2013.01); *G01R 27/04* (2013.01)

(58) Field of Classification Search
CPC ...... G01R 1/07; G01R 29/0878; G01R 29/10; G01R 31/001; G01R 31/002
See application file for complete search history.

(56) References Cited

U.S. PATENT DOCUMENTS

| | | | | |
|---|---|---|---|---|
| 4,973,911 A | * | 11/1990 | Marshall | G01R 29/0814 324/529 |
| 5,495,173 A | * | 2/1996 | Bockelman | G01R 1/06772 178/69 B |

(Continued)

*Primary Examiner* — Damon N Levi
*Assistant Examiner* — AB Salam Alkassim, Jr.
(74) *Attorney, Agent, or Firm* — Chang & Hale LLP

(57) ABSTRACT

Device for electric and magnetic measurements. In some embodiments, an electrical probe can be configured to include an unshielded inner conductor at an end of a coaxial assembly to allow an electrical field to induce differential-mode currents in the coaxial assembly. In some embodiments, a magnetic probe can be configured to include a loop connected to inner and outer conductors of a coaxial assembly to induce a common mode current by a change in magnetic field flux through the loop. In some implementations, such probes can be utilized to obtain near-field measurements to facilitate applications such as electromagnetic (EM) shielding designs.

20 Claims, 15 Drawing Sheets

(56) References Cited

U.S. PATENT DOCUMENTS

| | | | | |
|---|---|---|---|---|
| 6,177,804 B1* | 1/2001 | Pischl | | G01R 1/067 324/627 |
| 6,249,248 B1* | 6/2001 | Kitayoshi | | G01R 29/10 342/360 |
| 7,034,548 B2* | 4/2006 | Anderson | | G01R 27/32 324/600 |
| 7,541,818 B2* | 6/2009 | Kosaka | | G01R 31/001 324/754.29 |
| 7,741,853 B2* | 6/2010 | Blakely | | G01R 15/202 324/500 |
| 7,936,173 B2* | 5/2011 | Simon | | G01R 27/32 324/637 |
| 7,965,085 B2* | 6/2011 | Blakely | | G01R 15/202 324/117 R |
| 7,965,086 B2* | 6/2011 | Blakely | | G01R 15/202 324/509 |
| 8,089,266 B2* | 1/2012 | Rostamzadeh | | G01R 31/001 324/127 |
| 8,405,405 B2* | 3/2013 | Tsironis | | G01R 29/0878 324/638 |
| 9,244,145 B2* | 1/2016 | Min | | G01R 35/005 |
| 2002/0033706 A1* | 3/2002 | Khazei | | G01R 29/0821 324/750.22 |
| 2002/0039030 A1* | 4/2002 | Khazei | | G01R 29/0871 324/754.29 |
| 2002/0040466 A1* | 4/2002 | Khazei | | G01R 31/001 716/115 |
| 2002/0095304 A1* | 7/2002 | Khazei | | G01R 31/002 702/127 |
| 2004/0232776 A1* | 11/2004 | Ozaki | | G01R 29/0857 307/149 |
| 2006/0181287 A1* | 8/2006 | Motohashi | | G01R 31/002 324/613 |
| 2007/0024293 A1* | 2/2007 | Kosaka | | G01R 31/001 324/754.21 |
| 2007/0120563 A1* | 5/2007 | Kawabata | | G01R 33/0354 324/244.1 |
| 2008/0316123 A1* | 12/2008 | Kajiwara | | G01R 29/0878 343/703 |
| 2009/0085573 A1* | 4/2009 | Blakely | | G01R 15/202 324/509 |
| 2009/0184706 A1* | 7/2009 | Duric | | B82Y 25/00 324/202 |
| 2010/0033165 A1* | 2/2010 | Rostamzadeh | | G01R 31/001 324/127 |
| 2010/0073020 A1* | 3/2010 | Lim | | G01R 1/06788 324/754.03 |
| 2010/0174497 A1* | 7/2010 | Masuda | | G01B 7/004 702/57 |
| 2011/0204906 A1* | 8/2011 | Tsironis | | G01R 27/32 324/750.01 |
| 2013/0002273 A1* | 1/2013 | Min | | G01R 31/001 324/750.01 |
| 2013/0024148 A1* | 1/2013 | Nakamura | | G01R 29/0871 702/66 |
| 2014/0091972 A1* | 4/2014 | Hoang | | G01R 29/10 343/703 |
| 2014/0285189 A1* | 9/2014 | Kashmiri | | G01R 33/04 324/253 |
| 2015/0061702 A1* | 3/2015 | Kraver | | G01R 27/2605 324/686 |
| 2015/0123688 A1* | 5/2015 | Sappok | | G01R 1/06772 324/754.31 |
| 2016/0151106 A1* | 6/2016 | Buck | | A61B 18/1206 606/35 |
| 2016/0151109 A1* | 6/2016 | Buck | | A61B 18/1233 606/35 |
| 2016/0154034 A1* | 6/2016 | Buck | | G01R 15/18 324/117 R |
| 2016/0223699 A1* | 8/2016 | Peczalski | | G01R 19/0053 |
| 2017/0168101 A1* | 6/2017 | Inami | | G01R 29/08 |
| 2018/0034566 A1* | 2/2018 | Tankielun | | H04B 17/12 |

* cited by examiner

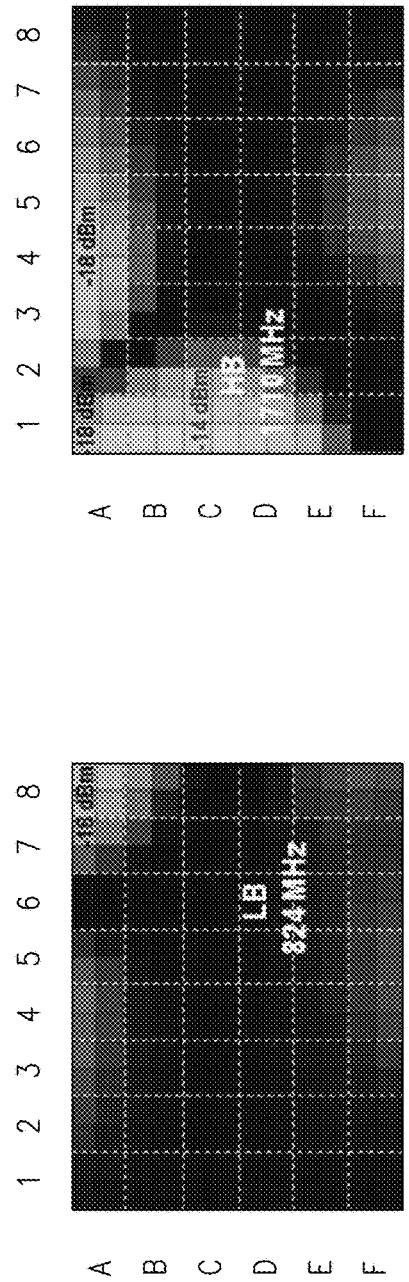
FIG.15D
FIG.15E
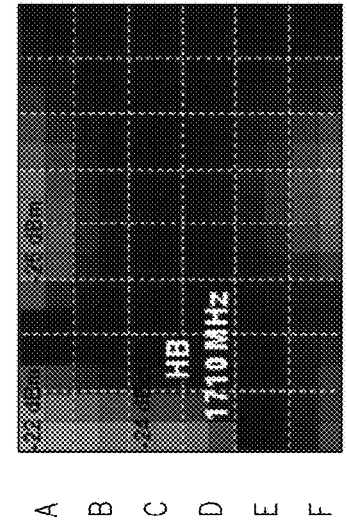
FIG.15G
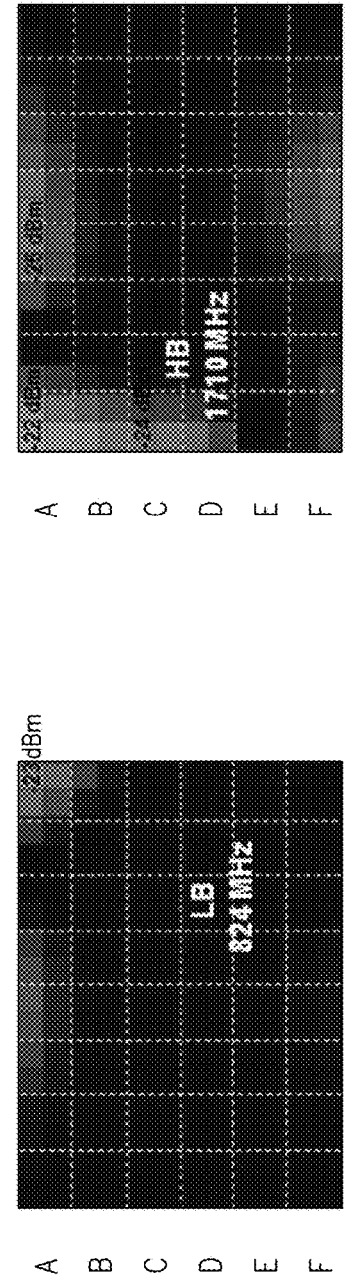
FIG.15F

DEVICE FOR ELECTRIC AND MAGNETIC MEASUREMENTS

CROSS-REFERENCE TO RELATED APPLICATIONS

This application is a continuation of U.S. patent application Ser. No. 14/020,796 filed Sep. 7, 2013 and entitled "SYSTEMS, DEVICES AND METHODS RELATED TO NEAR-FIELD ELECTRIC AND MAGNETIC PROBES," which claims priority to U.S. Provisional Application Nos. 61/698,615 filed Sep. 8, 2012 and entitled "SYSTEMS, DEVICES AND METHODS RELATED TO NEAR-FIELD ELECTRIC AND MAGNETIC PROBES," and 61/698,617 filed Sep. 8, 2012 and entitled "SYSTEMS AND METHODS RELATED TO NEAR-FIELD ELECTROMAGNETIC SCANNERS," each of which is expressly incorporated by reference herein in its entirety.

BACKGROUND

Field

The present disclosure generally relates to characterization of electromagnetic (EM) fields associated with radio-frequency (RF) modules.

Description of the Related Art

An electromagnetic (EM) field can be generated from or have an undesirable effect on a region of a radio-frequency (RF) device such as an RF module. Such an EM interference (EMI) can degrade the performance of wireless devices that use such an RF module. Some RF modules can be provided with EM shields to mitigate such performance issues associated with EMI.

SUMMARY

According to a number of implementations, the present disclosure relates to a probe for sensing an electromagnetic (EM) field proximate a radio-frequency (RF) device having lateral dimensions X and Y. The probe includes a coaxial assembly having a proximal end and a distal end. The coaxial assembly includes an inner conductor and an outer conductive shield between the proximal and distal ends. The probe further includes a sensing element implemented at the distal end of the coaxial assembly. The sensing element is configured to measure a field strength of the EM field. The sensing element has a dimension less than the lesser of the lateral dimensions X and Y to thereby allow a plurality of localized measurements of the EM field strengths associated with different locations of the RF device.

In some embodiments, the probe can further include a coaxial connector implemented at the proximal end of the coaxial assembly. The outer conductive shield can be connected to a ground during the localized measurements.

In some embodiments, the sensing element can be configured to sense the field strength of an electrical component of the EM field. The sensing element can include an unshielded extension of the inner conductor beyond the outer conductive shield at the distal end of the coaxial assembly. The unshielded extension can be configured so that an electric field acting on the unshielded extension results in opposite differential-mode currents flowing in the inner conductor and the outer conductive shield.

In some embodiments, the sensing element can be configured to sense the field strength of a magnetic component of the EM field. The sensing element can include a loop having a first end connected to a distal end of the inner conductor and a second end connected to a distal end of the outer conductive shield. The loop can be configured so that a change in magnetic field flux through the loop induces a detectable common mode current. The loop can have at least one turn, a rectangular shape, or a circular shape. For the circular shape example, the circular loop can have a diameter that is 1 mm or less.

In some embodiments, the coaxial assembly can have a characteristic impedance of approximately 50 ohms. In some embodiments, the field strength can include a near-field strength associated with the EM field strength present at a separation distance from a surface of the RF device. The separation distance can be approximately 1 mm or less.

In a number of teachings, the present disclosure relates to a method for testing a radio-frequency (RF) device. The method includes operating the RF device to generate an electromagnetic (EM) emission. The method further includes positioning a sensing element relative to the RF device to allow a measurement of the EM emission. The measure further includes measuring a field strength through the positioned sensing element. The measured field strength is representative of a field distribution over a selected area that is smaller than an overall lateral area of the RF device.

In some embodiments, the RF device can be a power amplifier module. In some embodiments, the selected area can be less than the overall lateral area by a factor of at least 10. The selected area can be less than or equal to approximately 1 mm$^2$.

In some embodiments, the field strength can include an electric field strength. In some embodiments, the field strength can include a magnetic field strength. In some embodiments, the field strength can include a near-field strength associated with the EM field strength present at a separation distance from a surface of the RF device, with the separation distance being approximately 1 mm or less.

In some implementations, the present disclosure relates to a system for testing a radio-frequency (RF) device. The system includes a control system configured to allow operation of the RF device. The system further includes a signal generator configured to provide an RF signal to the RF device so that the operating RF device generates an electromagnetic (EM) emission. The system further includes a measurement system that includes a probe configured to measure a field strength representative of a field distribution over a selected area that is smaller than an overall lateral area of the RF device.

According to some implementations, the present disclosure relates to a system for scanning for electromagnetic (EM) emission. The system includes a fixture system configured to hold a device under test (DUT) and provide electrical connections for the DUT. The system further includes an operating system connected to the fixture system and configured to allow operation of the DUT. The system further includes a measurement system configured to obtain field strength measurements representative of a field distribution over a plurality of selected areas of the DUT during the operation of the DUT, with each of the selected areas being smaller than an overall lateral area of the DUT.

In some embodiments, the operating system can include a radio-frequency (RF) source configured to provide an RF signal to the DUT. The field distribution can be a result of the operation of the DUT with the RF signal. The operating system can further include a power source configured to provide power to the DUT. The operating system can further include a controller configured to provide control signals to the DUT.

In some embodiments, the fixture system can include a printed circuit board (PCB) configured to hold the DUT and provide the electrical connections. The fixture system can further include a movable chuck table configured to facilitate the measurement of the field strength at each of the plurality of selected areas. The movable chuck table can be configured to move the PCB along lateral directions X and Y in increments ΔX and ΔY.

In some embodiments, the measurement system can include a magnetic field probe configured to sense a magnetic field strength. The magnetic field probe can include a loop having a first end connected to a distal end of an inner conductor and a second end connected to a distal end of an outer conductive shield. The inner conductor and the outer conductive shield can be arranged in a coaxial configuration, with the loop being configured so that a change in magnetic field flux through the loop induces a detectable common mode current. The loop can have a circular shape with a diameter that is 1 mm or less. The coaxial configuration can have a characteristic impedance of approximately 50 ohms.

In some embodiments, the measurement system can further include a pre-amplifier configured to amplify a signal representative of the common mode current. The measurement system can further include a spectrum analyzer configured to process the amplified signal. The measurement system can further include a processor configured to control the measurement system.

In some embodiments, the field distribution can include a near-field strength distribution associated with the field strength measurements obtained at a separation distance from a surface of the RF device. The separation distance can be approximately 1 mm or less.

In a number of implementations, the present disclosure relates to a method for scanning for electromagnetic (EM) emission. The method includes holding a device under test (DUT). The method further includes performing an operation associated with the DUT. The method further includes obtaining field strength measurements representative of a field distribution over a plurality of selected areas of the DUT during the operation of the DUT, with each of the selected areas being smaller than an overall lateral area of the DUT.

In some embodiments, at least the measuring of the field strength can be performed automatically under control of a processor. In some embodiments, each of the selected areas can be smaller than the overall area of the DUT by a factor of at least 10.

In some embodiments, the DUT can be a power amplifier module. The power amplifier module can include an electromagnetic shield. Dimensions of each of the selected areas can be selected so that removal of a single unit of the electromagnetic shield is detectable by the measured field strength. The single unit can include a shielding wirebond.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/020,797, titled "SYSTEMS AND METHODS RELATED TO NEAR-FIELD ELECTROMAGNETIC SCANNERS," filed on even date herewith and hereby incorporated by reference herein in its entirety.

BRIEF DESCRIPTION OF THE DRAWINGS

FIGS. 15A-15G show an example RF module and field measurements associated with various operating conditions, such that the RF module can be characterized in a localized manner.

DETAILED DESCRIPTION OF SOME EMBODIMENTS

The headings provided herein, if any, are for convenience only and do not necessarily affect the scope or meaning of the claimed invention.

Figure 1:
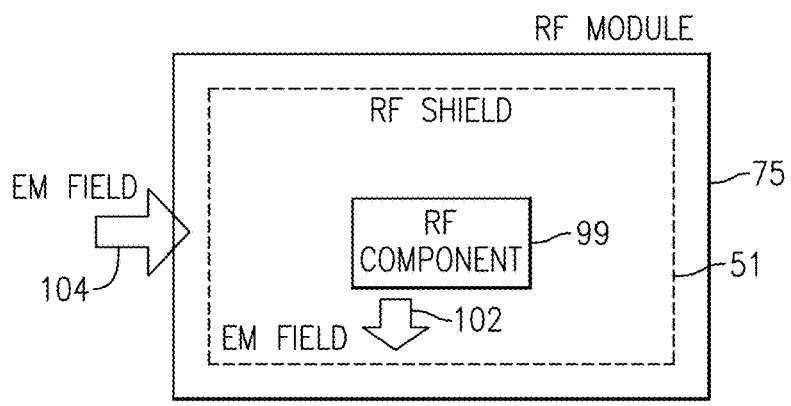
FIG. 1 schematically depicts a radio-frequency (RF) module, where electromagnetic (EM) field into and/or out of the module can be characterized as described herein.
Figure 2:
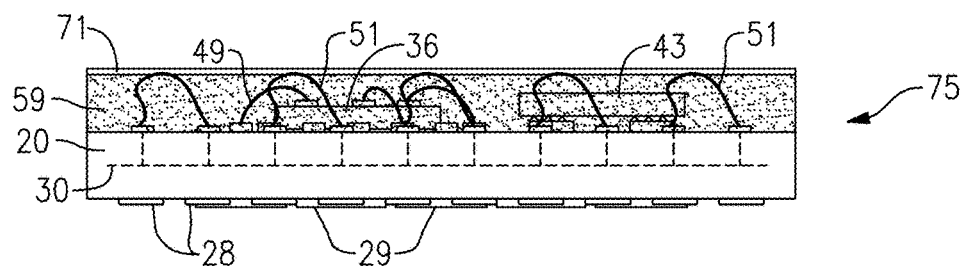
FIG. 2 shows an example of an RF shield that can be included in the module of FIG. 1.
Figure 3:
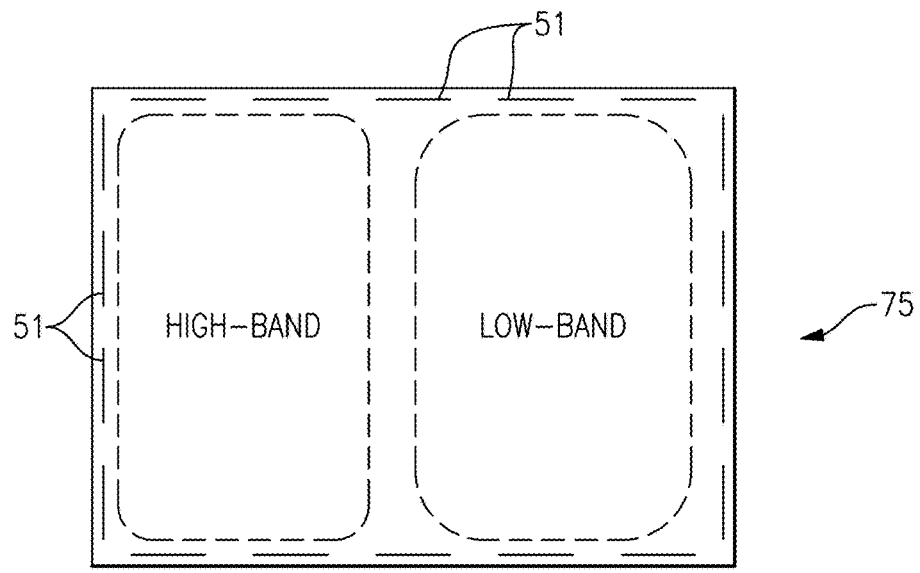
FIG. 3 shows that in some implementations, the module of FIG. 1 can be configured to provide functionalities associated with two or more operating modes.

FIGS. 1-3 show examples of radio-frequency (RF) modules that can be characterized effectively by devices, systems, and/or method as described herein. In some embodiments, such RF modules can be packaged modules.

Although described in the context of such RF modules, it will be understood that one or more features described herein can also be utilized in other non-modular RF applications, including, for example, RF circuits that are not packaged.

FIG. 1 shows that an RF module 75 can include an RF component 99. As described herein, such a component can include, for example, a die having one or more integrated circuits, a passive component (such as a surface-mount device (SMD)), a connection feature, or some combination thereof. Such a component can emit an electromagnetic (EM) field (depicted as an arrow 102) during operation, and/or can be susceptible to an EM field 104 generated elsewhere. In some situations, it is desirable to keep the RF component 99 isolated to prevent the EM field 102 from leaving the module 75 and/or to prevent the EM field 104 from entering the module 75.

FIG. 1 further shows that in some embodiments, a module 75 can include an RF shield configured to provide the foregoing isolating functionality. Non-limiting examples of such an RF shield are described in International Publication No. WO 2010/014103 (International Application No. PCT/US2008/071832, filed on Jul. 31, 2008, titled "SEMICONDUCTOR PACKAGE WITH INTEGRATED INTERFERENCE SHIELDING AND METHOD OF MANUFACTURE THEREOF") and U.S. Publication No. US 2007/0241440 (U.S. application Ser. No. 11/499,285, filed on Aug. 4, 2006, titled "OVERMOLDED SEMICONDUCTOR PACKAGE WITH A WIREBOND CAGE FOR EMI SHIELDING"), each of which is incorporated herein by reference in its entirety. Although various modules are described herein in the context of shielding-wirebonds, it will be understood that one or more features of the present disclosure can also be utilized in other types of shielding configurations.

In the example context of shielding-wirebond configuration, FIG. 2 shows a sectional side view of a module 75 having a plurality of shielding-wirebonds 51 disposed near the periphery of the module 75 (e.g., see FIG. 3). Such shielding-wirebonds 51 are shown to be formed on a packaging substrate 20 (e.g., a laminate substrate) and encapsulated by an overmold structure 59. Upper portions of the shielding-wirebonds 51 are shown to be exposed on an upper surface of the overmold structure 59, so as to be in electrical contact with a conductive layer 71 (e.g., a layer of sprayed-on metallic paint). Lower portions of the shielding-wirebonds 51 are shown to be electrically connected to a ground plane 30, so that a combination of the ground plane 30, the shielding wirebonds 51, and the conductive layer 71 forms an RF-isolated volume on the packaging substrate 20.

Such an RF-isolated volume can provide RF-isolation for one or more RF components such as a die 36 and an SMD 43. The example die 36 is depicted as being connected to other parts of the module 75 by connection-wirebonds 49. Such connections can facilitate passage of power and signals to and/or from the die 36 through, for example, I/O connection pads 28. External grounding of the ground plane 30 (and other grounds in the module 75) can be facilitated by the grounding pads 29.

FIG. 3 shows that in some implementations, the foregoing examples of RF components can include circuits configured to provide RF functionalities associated with wireless devices. For example, a power amplifier (PA) circuitry can be implemented in a module 75 having shielding-wirebonds 51. In some embodiments, such a PA circuitry can be configured to operate at different bands and/or modes. For example, a circuit associated with a high-band can reside generally in one area, and a circuit associated with a low-band can reside generally in another area. Although described in the example context of PA circuits, it will be understood that one or more features of the present disclosure can also be applied to other types RF circuits.

As described herein, being able to characterize EM emissions in a localized manner can be important for a number of applications. For example, locations of such field emissions can be identified. Based on such locations, modifications such as the circuit itself, position of the circuit within the module, and/or position of the module relative to other components (e.g., on a circuit board of a wireless device) can be effectuated. In another example, a shielding configuration can be modified or designed based on knowledge of such localized characterization of EM emissions.

Figure 4:
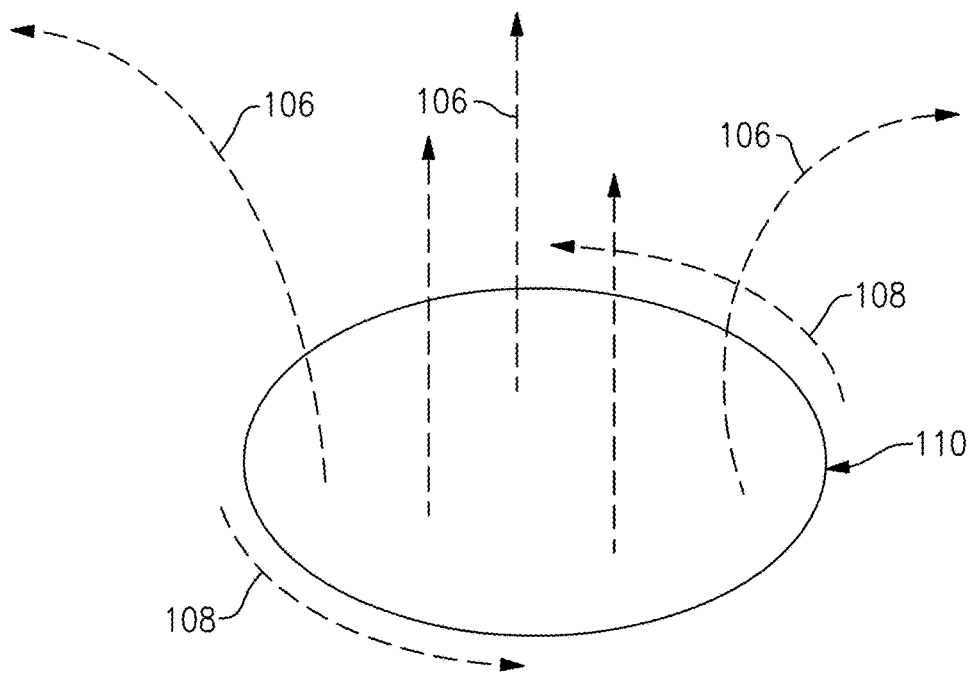
FIG. 4 shows an example of how magnetic field can be detected by an inductive magnetic probe having a current-inducing loop.

FIG. 4 shows an example of how EM emissions can be detected by sensing magnetic fields associated with such EM emissions. Based on Faraday's law of induction applied to a conductive loop 110, oscillation of magnetic field 106 flux through the loop 110 induces a current 108 in the loop 110. If two ends of the loop 110 are electrically connected to their respective terminals, an induced voltage amplitude Vg between the two terminals can be represented as $$V_g = Bn\omega A \cos \theta, \quad (1)$$

where B is the magnetic field amplitude, n is the number of loop turns, $\omega$ is the angular frequency associated with the oscillation, A is the loop area, and $\theta$ is the angle between the magnetic field and the normal direction of the loop area (assuming a generally uniform magnetic field direction).

Figure 5:
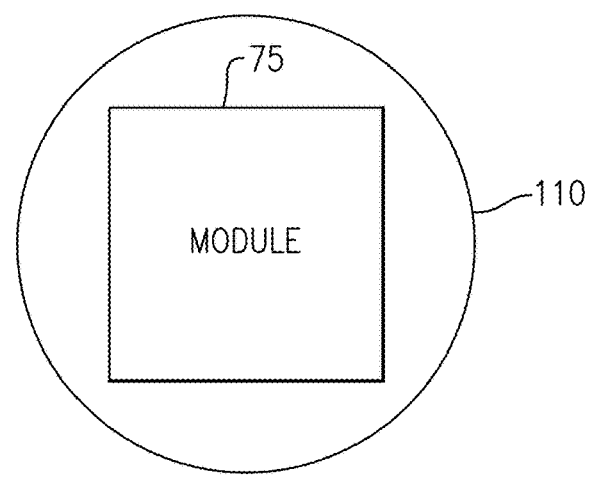
FIG. 5 shows that if a current-inducing loop of a magnetic probe is too large relative an RF module being tested, localized EM field characterization of the RF module is difficult or impossible.

FIG. 5 shows that if an EM sensing element 110 (such as the loop of FIG. 4) is too large relative a device under test (DUT) 75, then localized characterization of the DUT by the sensing element 110 can become difficult or impossible. In a given position of the sensing element 110 relative to the DUT 75, one generally cannot determine where on the DUT an EM field is emitted due to the sensing element being too large.

It is possible to move either or both of the DUT 75 and the sensing element 110 so that relative displacements are smaller than a dimension of the DUT 75. Even with such configurations, measurements will generally yield only average values that likely do not provide localized information.

Disclosed herein are examples of devices and measurements related to a miniature near-field probe capable of very fine resolution that allows high precision localized measurement of EM field emission from a small DUT such as an RF module. In some situations, such localized measurements can allow EM emission detection even on a single pin of an RF module. Although such near-field probes are described herein in the example context of characterizing of RF modules, it will be understood that one or more features described herein can also be utilized in other applications. For example, near-field probes having one or more features described herein can also be used to sniff emissions from anywhere on a circuit board (e.g., a phone board) level. Also, although various examples are described in the context of emissions from a given location, it will be understood that one or more features of the present disclosure can also be utilized for localized characterization of EM fields entering a given location, whether or not such a location includes an EM field emitter. In such a situation, an RF component at such a location may not emit significant amount of EM field, but it may be susceptible to EM fields that are generated elsewhere.

Figure 6:
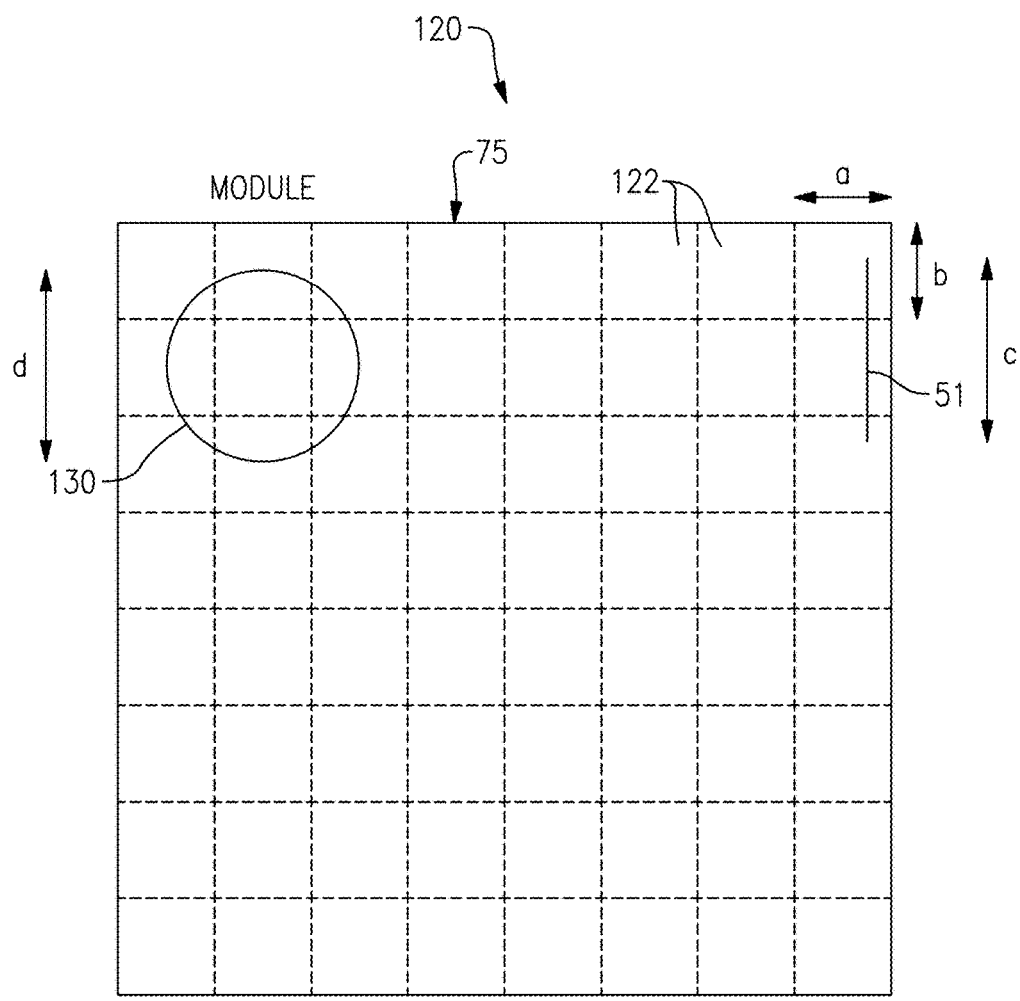
FIG. 6 shows that in some implementations, a probe having one or more features described herein can be configured to allow localized characterization of an RF module being tested.

In the context of an RF module, FIG. 6 shows an example measurement configuration 120, where a near-field sensing element 130 is dimensioned to allow localized EM emission characterization of a module 75. The example sensing element 130 (e.g., a circular loop) is shown to have a representative dimension "d" (e.g., diameter of the circular loop) that allows characterization of localize regions (e.g., squares) 122 having dimensions "a"×"b." In some embodiments, dimensions associated with such localized regions can be sufficiently small so as to be capable of measurements that are affected by one shielding wirebond 51 (having a lateral dimension of "c"). Such effects associated with a single shielding wirebond can include, for example, presence or absence of the shielding wirebond.

In some implementations, the localized EM emission characterization can be sufficiently sensitive to measure effects resulting from modification of shielding configurations associated with one or more shielding wirebonds. Other measurement situations can also benefit from near-field EM measurement techniques described herein.

In some implementations, a miniature near-field probe that can facilitate the foregoing measurement capability and having features as described herein can be one or combination of two types. The first type can be configured to include a shaped magnetic loop (e.g., circular or rectangular) having a dimension (e.g., diameter or side-dimension of a rectangle) that is, for example, 1 mm or less. Other dimensions that are larger than the example 1 mm dimension can also be utilized. Such a loop can be configured to provide high sensitivity to magnetic fields.

The second type can include an electric field probe (also referred to herein as an E-probe) having an exposed conductive tip or needle at the end. As described herein, such a probe can be configured for detection of electric fields.

Figure 8:
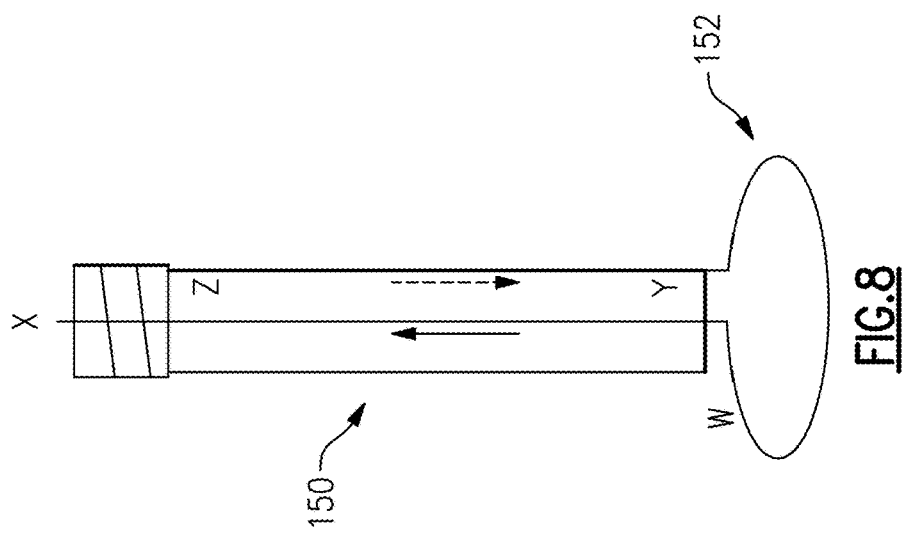
FIG. 8 schematically depicts a magnetic probe that can function as the probe of FIG. 6.
Figure 7:
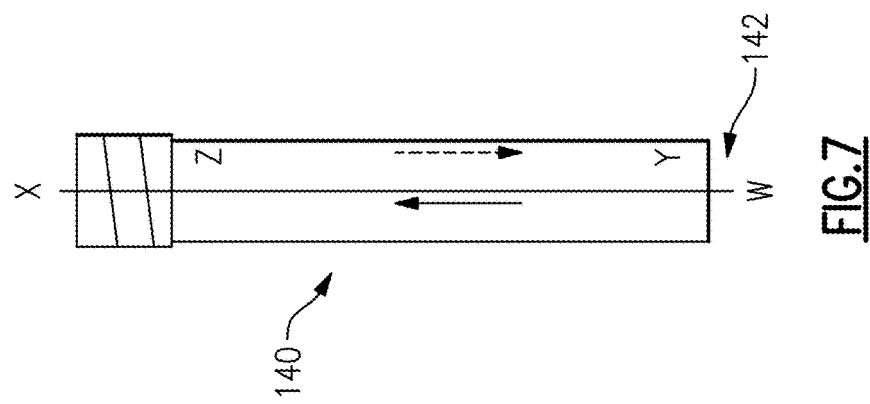
FIG. 7 schematically depicts an electric probe that can function as the probe of FIG. 6.

FIGS. 7 and 8 show examples of an electric field probe 140 and a magnetic field probe 150 that can be configured to achieve the foregoing near-field measurements for localized characterization of RF modules. In some embodiments, each of the electric and magnetic field probes 140 and 150 can include a length of coaxial portion (e.g., a hard coaxial cable) having an inner conductor surrounded by an outer conducting shield. An inner insulator (e.g., a dielectric material) can be disposed between the inner conductor and the outer conducting shield. An outer insulating sheath (e.g., plastic sheath) can be provided to cover the conducting shield.

During operation, the outer conducting shield can be connected to a ground. In some implementations, such a ground can be connected to a DUT ground or an equipment (e.g., spectrum analyzer) ground. For the various examples described herein, the ground of the outer conducting shield is connected to the equipment ground.

In some embodiments, the coaxial probe can have a characteristic impedance (e.g., 50 ohms) generally compatible with an impedance characteristic of an RF circuit associated with the DUT. For connectivity, a connector such as an SMA connector can be provided on one end of the coaxial portion. The other end of the coaxial portion can be the sensing end, and can be configured as follows, depending on whether the coaxial probe is used as an electric or magnetic field probe.

As shown in FIG. 7, the sensing end 142 of the coaxial probe 140 can be configured so that the distal end of the inner connector is exposed and not shielded by the outer conducting shield. The exposed distal end of the inner connector may or may not extend beyond the distal end of the outer conducting shield. In some embodiments, the distal end of the exposed inner conductor can be left unconnected. Such a configuration of the sensing end 142 can allow sensing of electric fields while being generally insensitive to magnetic fields. An electric field sensed by the foregoing example configuration can result in a differential-mode current flowing in one direction along the inner conductor (e.g., away from the distal end of the probe 140), and a balanced current flowing in the opposite direction along the outer conducting shield (e.g., towards the distal end of the probe 140).

As shown in FIG. 8, the sensing end 152 of the coaxial probe 150 can be formed by exposing a length of the inner conductor and forming a loop with the exposed inner conductor. The end of the exposed inner conductor can be connected (e.g., soldered) to the outer conducting shield. In some embodiments, such a loop formed by the exposed inner conductor can have a selected size and/or shape. For example, a generally circular shaped loop having a diameter can be formed. Such a diameter can be selected to be, for example, approximately 1 mm to facilitate magnetic field measurements associated with EM emissions at an example range of approximately 0.8 to 3.0 GHz. At other frequencies and/or measurement settings, other loop dimensions larger or smaller than 1 mm can be utilized. For example, at a higher frequency, a smaller loop diameter can be utilized to increase the sensitivity of the sensing end 152 and provide finer resolution. As described herein, variations in magnetic field flux can induce an unbalanced flow of a common-mode current in the loop, and such a current can be detected through the inner conductor.

As described in reference to FIG. 7, the example electric field probe 140 demonstrates a differential mode current phenomenon where, for example, a current flows from node W to node X (depicted as a solid-line arrow), and a balanced current having generally the same magnitude but opposite direction flows from node Z to node Y (depicted as a dashed-line arrow). Therefore, the two opposite-direction currents substantially cancel out, thereby not being sensitive or suitable for magnetic field measurements. However, an electrical potential exists between the inner conductor at the tip and the outer conducting shield. Such an electric potential can be relatively small in some EM measurement situations. Accordingly, such a probe can be used for electric field measurements, but with less sensitivity due to the foregoing low measurable potential value.

As described in reference to FIG. 8, the loop configuration of the sensing end 152 can yield sensitivities to both electric and magnetic fields. However, the magnetic field can dominate because the loop creates an unbalanced current flow (also referred to herein as a common mode current). Such a current resulting from sensing of magnetic fields and flowing around the loop generally does not get canceled. Accordingly, such a probe can be utilized for magnetic field measurements.

Figure 9:
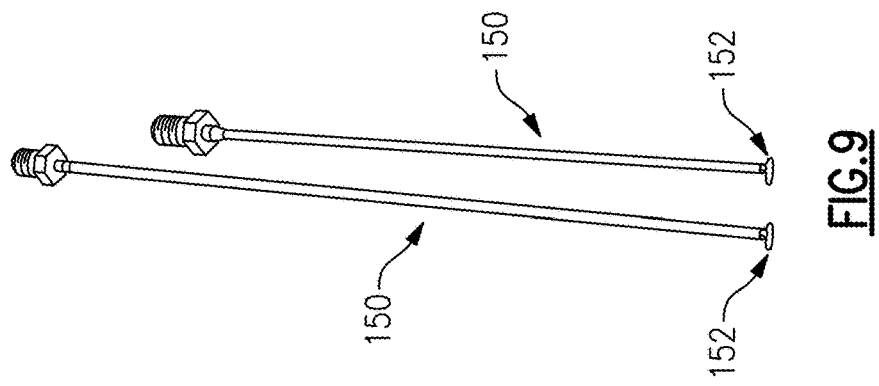
FIG. 9 shows examples of the magnetic probe of FIG. 8.

FIG. 9 shows two examples of the magnetic field probe 150 as described in reference to FIG. 8. As shown, the probe can be configured with different design parameters. For example, different coaxial dimensions (length and/or sectional dimensions) can be implemented. In another example, the sensing end loop size and/or shape can be selected for different measurement applications.

Figure 10A:
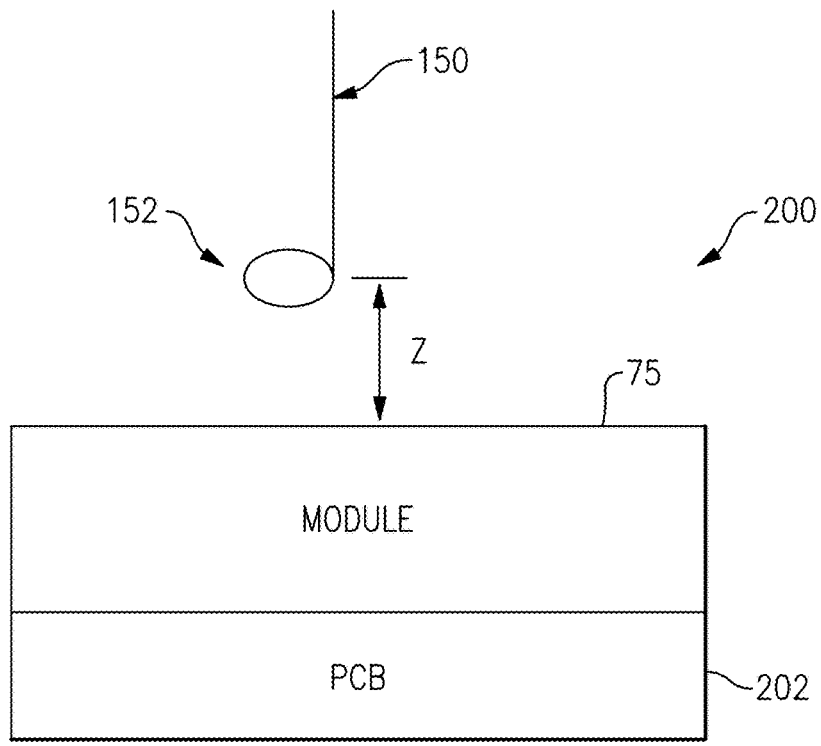
FIGS. 10A and 10B show an example near-field measurement configuration that can facilitate the localized field characterization of FIG. 6.
Figure 10B:
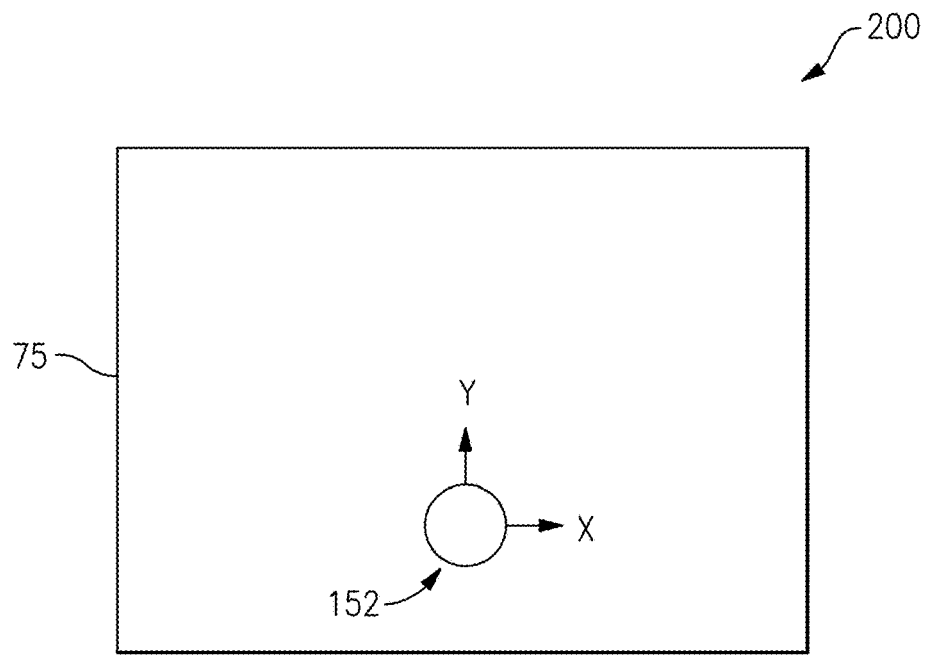

FIGS. 10A and 10B schematically depict side and plan view of a near-field scanning configuration 200 that utilizes a magnetic probe 150 described in reference to FIGS. 8 and 9. In the example, a sensing end 152 of the magnetic probe 150 is shown to be positioned over a DUT (e.g., an RF module) 75 at a coordinate (X, Y, Z), with X and Y defining lateral directions on the DUT 75, and Z defining a vertical direction relative to the DUT 75. In some implementations, the value of Z (height above the DUT 75) can be held substantially uniform (e.g., at approximately 1 mm) as measurements are made at different X and Y locations.

Figure 11:
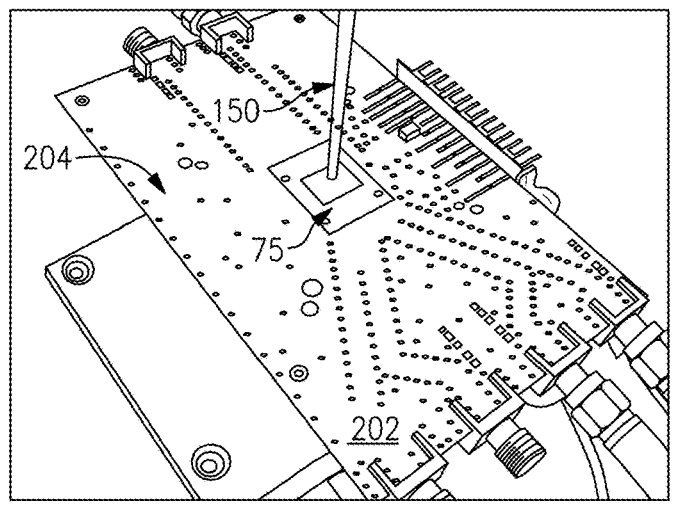
FIG. 11 shows an example measurement apparatus that can facilitate the near-field measurement configuration of FIGS. 10A and 10B.

In the example shown in FIG. 10A, the DUT 75 is depicted as being positioned on a platform 202 such as a printed circuit board (PCB) during the near-field scan. FIG. 11 shows an example of a test fixture 204 that includes a PCB 202 that can act as the foregoing testing scanning platform. The PCB 202 is shown to be configured to receive a DUT 75 and provide connections for operation of the DUT during a scan with a near-field probe such as a magnetic field probe 150.

Figure 12:
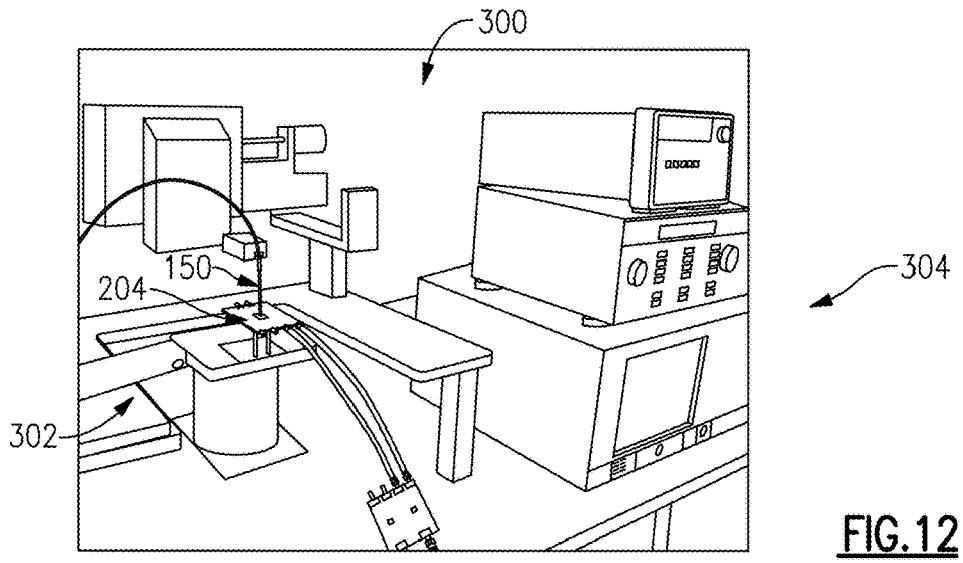
FIG. 12 shows an example measurement system having the measurement apparatus of FIG. 11.
Figure 13:
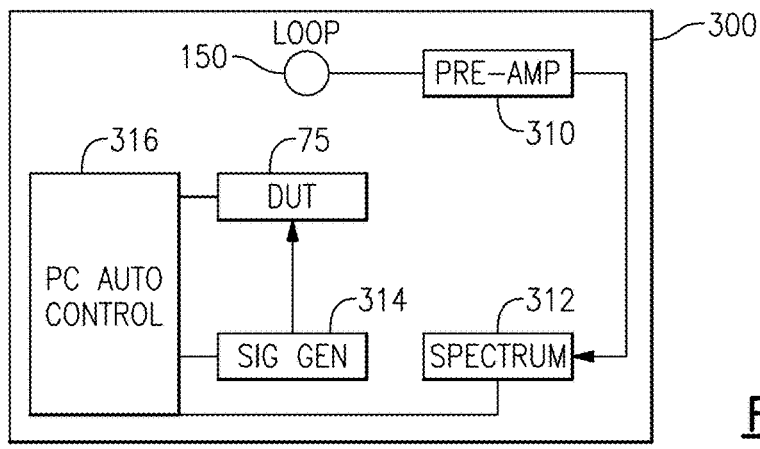
FIG. 13 schematically depicts the measurement system of FIG. 12.
Figure 14:
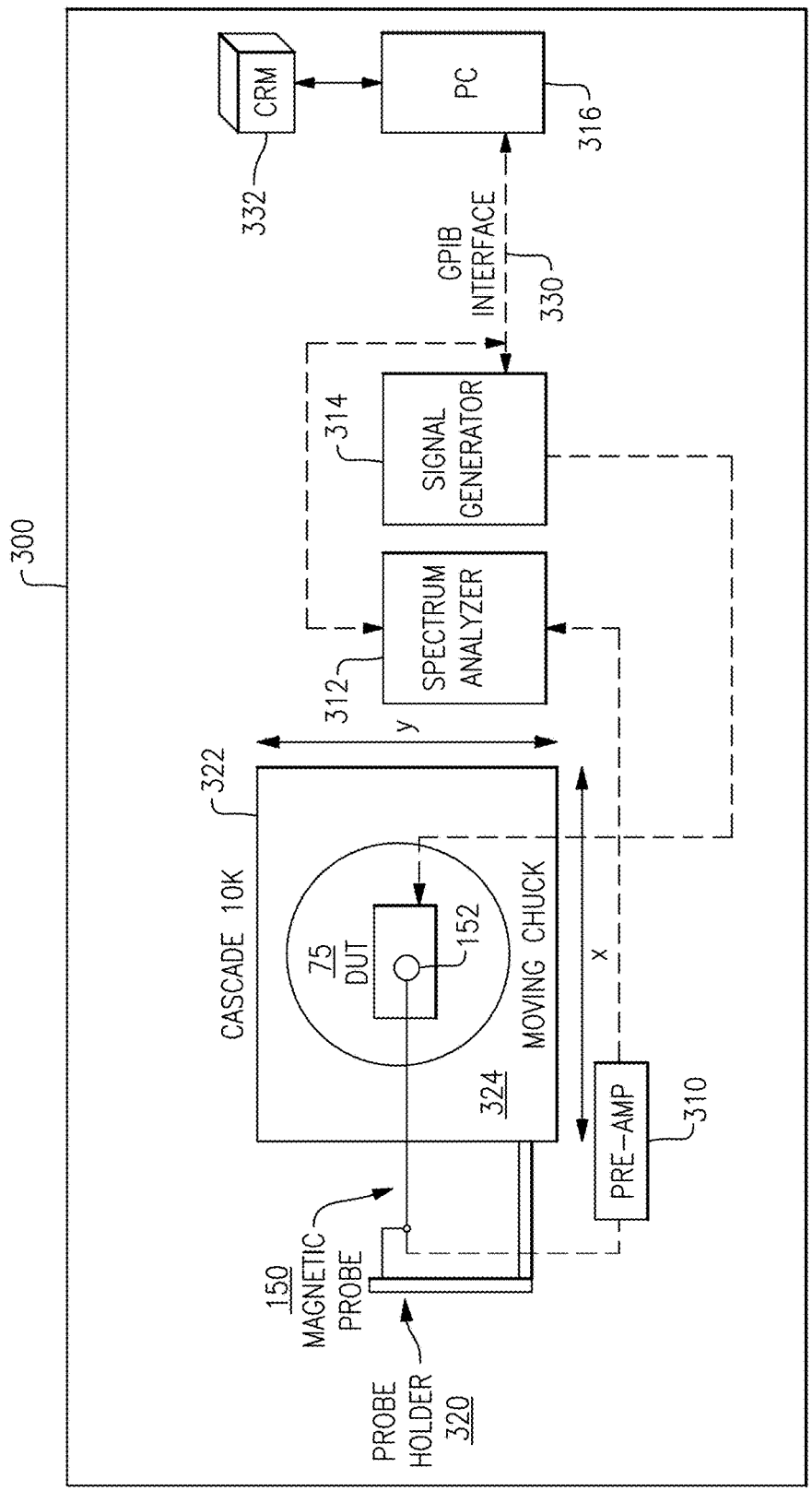
FIG. 14 schematically depicts a more specific example of the system of FIG. 13.

In some implementations, the foregoing test fixture 204 can be part of a test system 300, examples of which are shown in FIGS. 12-14. In FIG. 12, the test fixture 204 is shown to be mounted on a movable chuck table 302 configured to provide lateral motion of the DUT relative to the probe 150. The probe 150 is shown to be mounted to a probe-holding apparatus that allows, for example, adjustment of the height of the probe 150 and independent lateral motion of the probe 150.

FIG. 12 further shows that the test system 300 can include a plurality of test equipment 304 configured to, for example, operate the DUT and process measured signals from the probe 150. For example, FIG. 13 schematically shows that the DUT 75 can be operated by being provided with RF signals from a signal generator 314. The signal generator 314 (e.g., Agilent 8648C) can be under the control of, and/or be monitored by a controller 316. In the example shown, the controller 316 can be based on a computing device having a processor. During operation of the DUT (e.g., the PA modules described in reference to FIGS. 15 and 16) and EM measurements, the output of the PA can be terminated by 50 ohms and be attenuated by 30 dB.

In some implementations, and as shown in FIGS. 13 and 14, signals obtained from the probe 150 can be amplified by a pre-amplifier 310 (e.g., approximately 20 dB gain), and be processed further by a spectrum analyzer 312. Signals processed in the foregoing example can be provided to the controller 316 for further analysis and/or storage.

In some implementations, and as shown in FIGS. 13 and 14, the DUT 75 can be moved during the scan under the control of the controller 316. Such controlled motion of the DUT 75 can be facilitated by a moving chuck 324 of a chuck table 322 (e.g., Cascade model 10000). Such a chuck table can be configured to provide different sized steps in lateral movements of the DUT 75, including those associated with example scans as described herein.

In some implementations, and as shown in FIG. 14, various signals associated with controls and measurements can be facilitated by an interface such as a general purpose interface bus (GPIB) depicted as 330. Further, the controller 316 can be configured to be in communication with a computer-readable medium (CRM) 332 for storing, for example, measured data and/or various computer-executable instructions for performing and/or inducing various functionalities associated with the controller 316. In some implementations, such computer-executable instructions can be stored in a non-transitory manner.

Figure 15A:
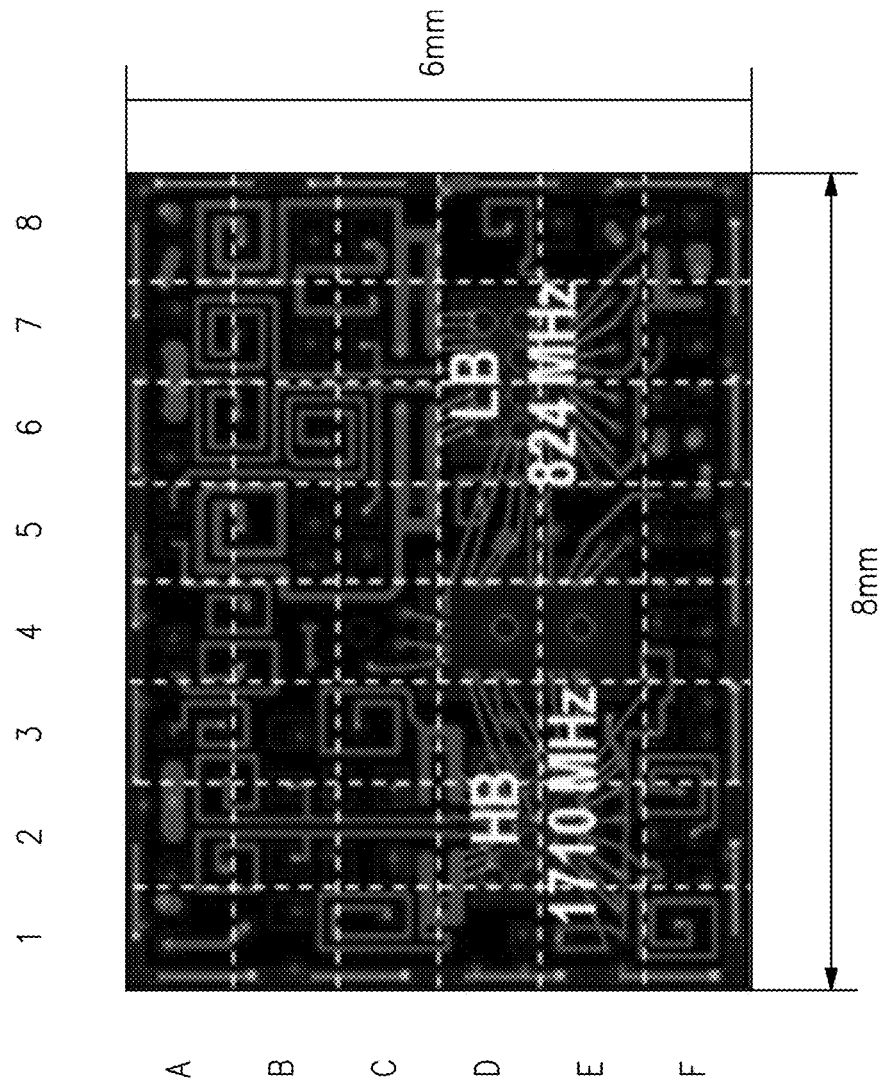

FIGS. 15 and 16 show examples of magnetic field measurements that show localized EM emissions for two example RF modules. FIG. 15A shows an example PA module configured to operate in GSM bands of 824 MHz ("lowband" or "LB") and 1710 MHz ("highband" or "HB"). The example packaged module has a 6×8 mm form factor, and the localized characterization capability of near-field scanning as described herein allows the module's area to be divided into, for example, 1 mm squares.

Figure 15B:
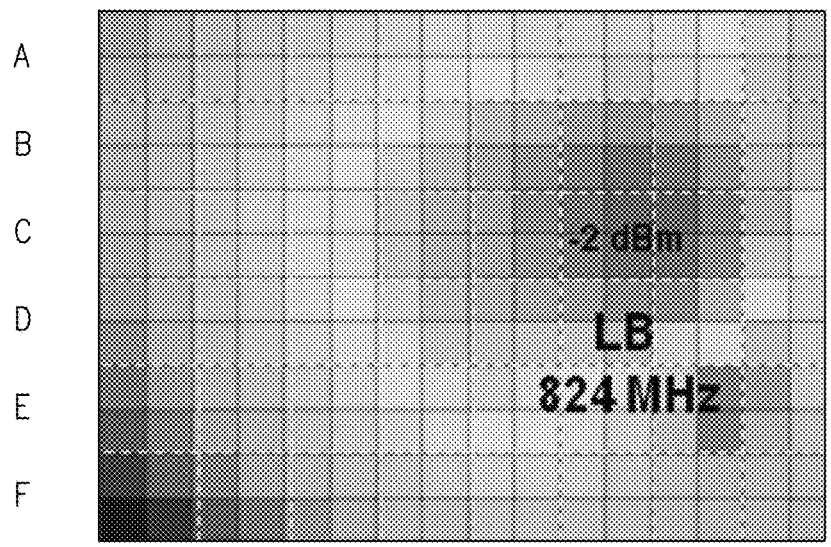
Figure 15C:
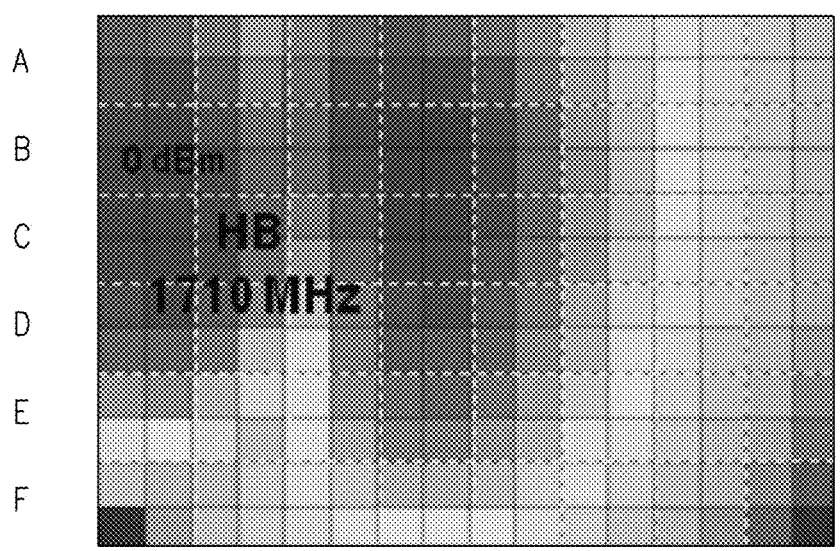

To perform example magnetic field measurements shown in FIGS. 15B and 15C for such 1 mm squares, a fine resolution magnetic loop sensor having an approximately 1 mm diameter was positioned approximately 1 mm (Z direction) above the PA module. The PA module was moved (by the moving chuck 324 in FIG. 14) in approximately 0.5 mm steps in X and Y directions; and a total of 221 data points were collected for each band operation.

For the measurements shown in FIGS. 15B and 15C, the PA module is not shielded. Thus, during the lowband operation (FIG. 15B), the region at or near the lowband circuit is shown to have high magnetic field values expressed in power unit (e.g., a peak at a −2 dBm level). Similarly, during the highband operation (FIG. 15C), the region at or near the highband circuit is shown to have even higher magnetic field values expressed in power unit (e.g., a peak at a 0 dBm level). If at least −20 dBm suppression of EM emission is desired (as measured by magnetic field strength), then one can see that the unshielded configuration shown in FIGS. 15B and 15C fails such a requirement.

The measurement results shown in FIGS. 15D and 15E are for the same PA module of FIGS. 15B and 15C, but with a generally ineffective shielding configuration. During the lowband operation (FIG. 15D), a region at the upper right corner is shown to have a magnetic field value (expressed in power unit) of −18 dBm that is higher than the example desired −20 dBm threshold. Similarly, during the highband operation (FIG. 15E), various locations about the highband circuit are shown to have magnetic field values (expressed in power unit) of −14 dBm, −18 dBm, and −18 dBm that are also higher than the desired −20 dBm threshold. Thus, a shielding configuration that allows such EM emissions can be considered to be ineffective if compared to the example −20 dBm threshold standard.

The measurement results shown in FIGS. 15F and 15G are for the same PA module of FIGS. 15B and 15C, but with a more effective shielding configuration. During the lowband operation (FIG. 15F), a region at the upper right corner is shown to have a magnetic field value (expressed in power unit) of −23 dBm that is lower than the example desired −20 dBm threshold. Similarly, during the highband operation (FIG. 15E), various locations about the highband circuit are shown to have magnetic field values (expressed in power unit) of −24 dBm, −22 dBm, and −25 dBm that are also lower than the desired −20 dBm threshold. Thus, a shielding configuration that allows such EM emissions can be considered to be effective if compared to the example −20 dBm threshold standard.

FIGS. 16A-16F show magnetic field measurement results using another example PA module. The example PA module is configured to operate in GMSK bands of 824 MHz ("lowband" or "LB") and 1710 MHz ("highband" or "HB"). During operation, the example PA is provided with a 5 dBm input to yield an output power of approximately 34 dBm. The example PA module has a 6×8 mm form factor, and the measurement configuration is similar to that described in reference to FIG. 15.

Figure 16A:
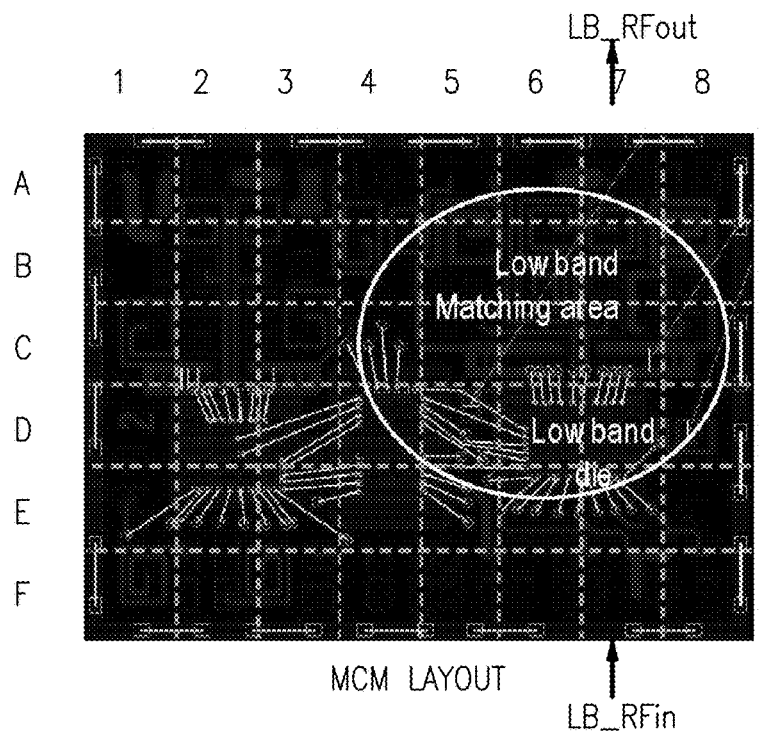
FIGS. 16A-16F show another example RF module and field measurements associated with various operating conditions, such that the RF module can be characterized in a localized manner.
Figure 16B:
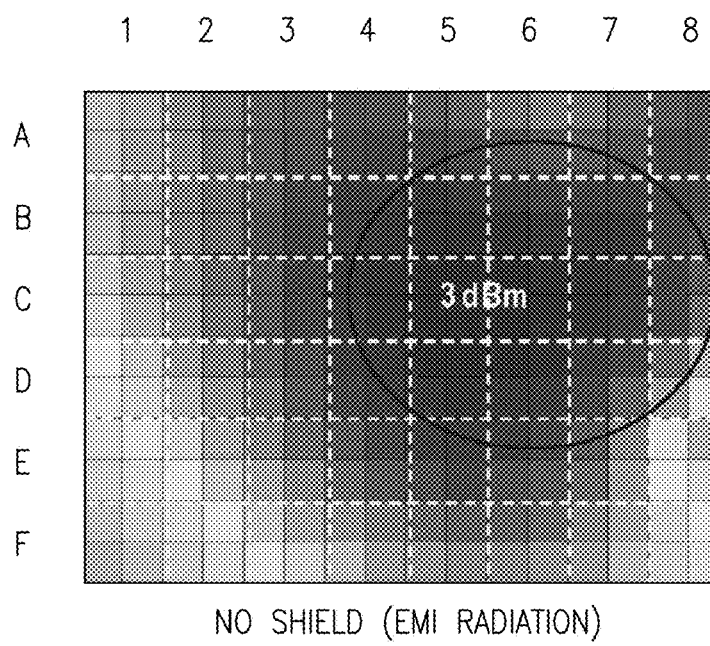
Figure 16C:
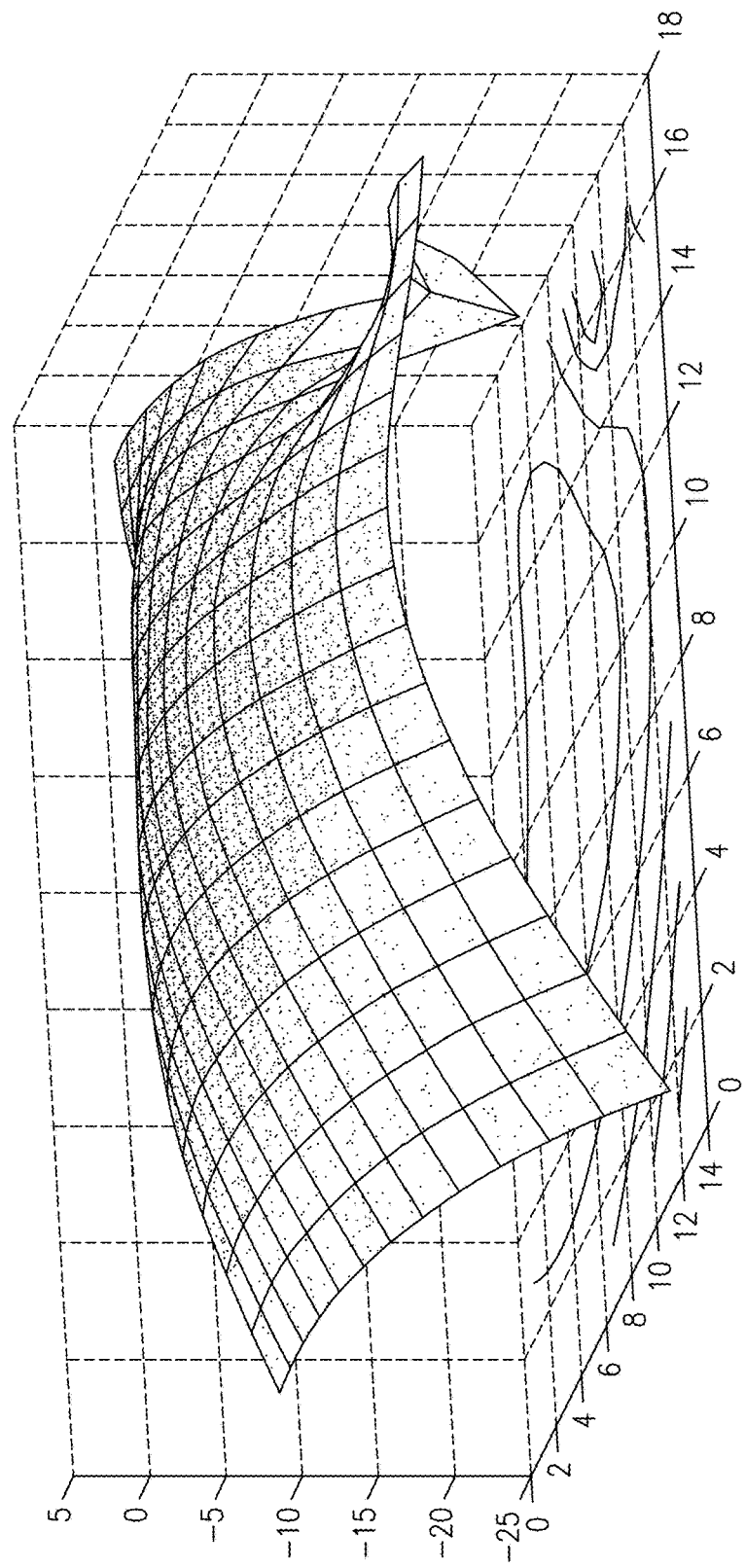

FIG. 16A shows the example GMSK PA module with its lowband operating through a lowband PA die and a corresponding matching circuit. The RF input and output for the lowband amplifier are also shown. FIG. 16B shows measurement results for the unshielded PA module operating in the lowband configuration of FIG. 16A. FIG. 16C shows the same measurement results in a 3-dimensional contour plot. One can see that the contour includes a peak region generally above the lowband PA/matching area with a magnetic field strength (expressed in power unit) of about 3 dBm. One can see that without shielding, the EM emission is generally spread over a relatively wide area about the lowband PA/matching area.

Figure 16D:
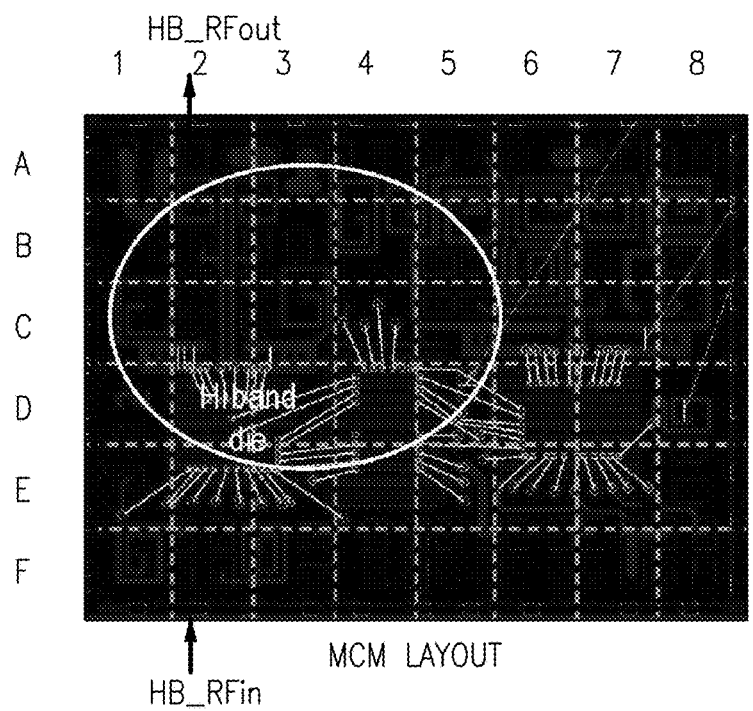
Figure 16E:
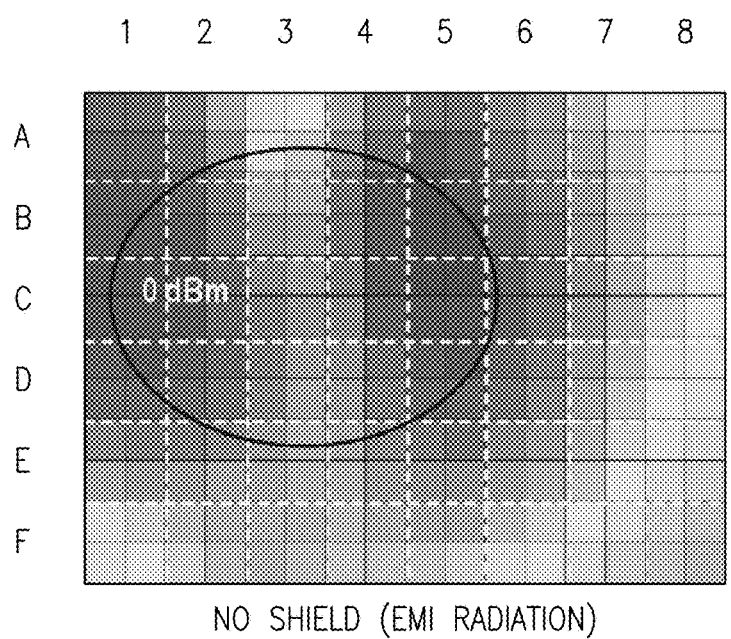
Figure 16F:
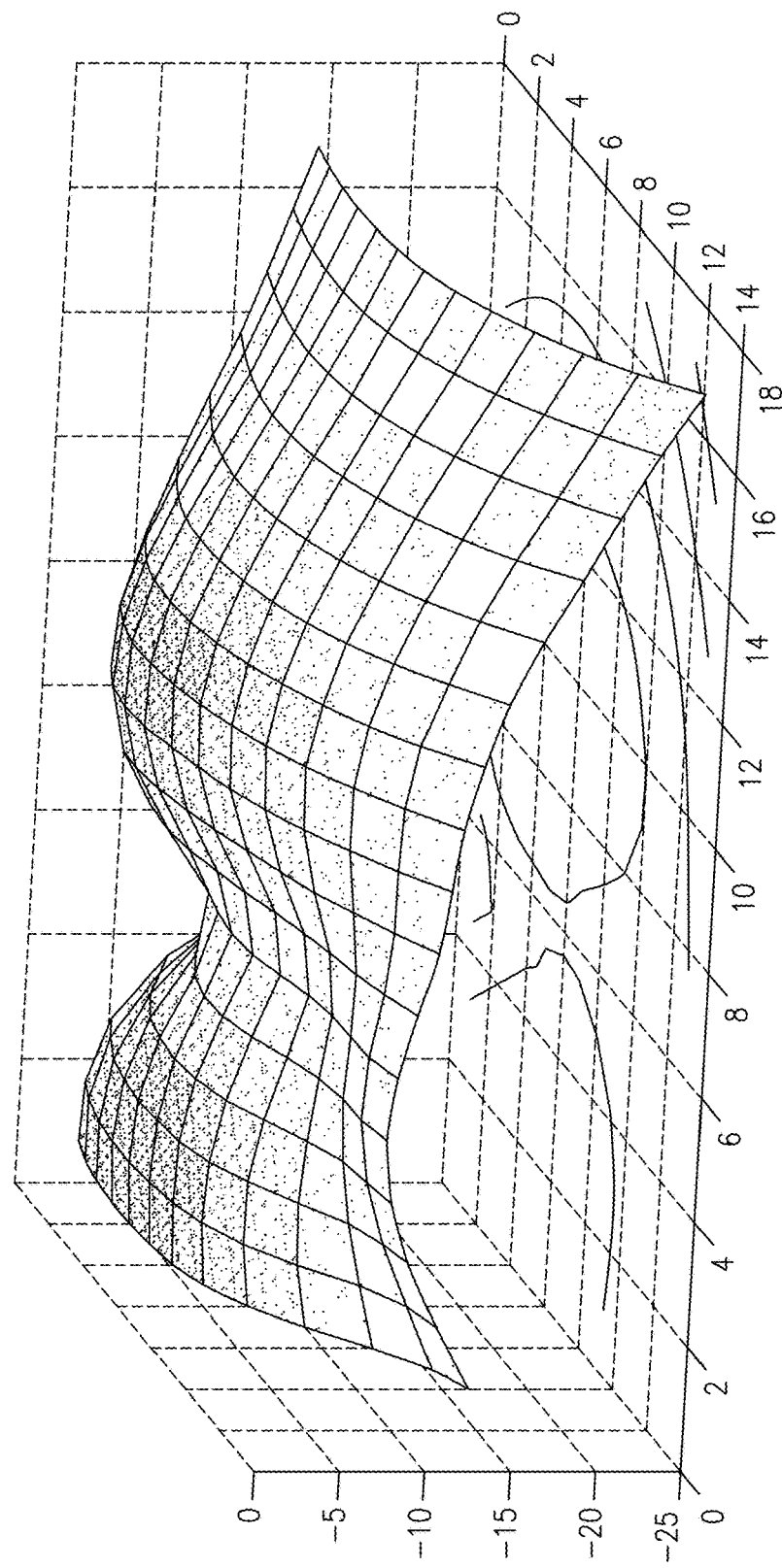

FIG. 16D shows the example GMSK PA module with its highband operating through a highband PA die and a corresponding matching circuit. The RF input and output for the highband amplifier are also shown. FIG. 16E shows measurement results for the unshielded PA module operating in the highband configuration of FIG. 16D. FIG. 16F shows the same measurement results in a 3-dimensional contour plot. One can see that the contour includes a peak region generally above the highband PA/matching area with a magnetic field strength (expressed in power unit) of about 0 dBm. One can see that without shielding, the EM emission is generally spread over a relatively wide area about the highband PA/matching area.

Similar to the examples described in reference to FIGS. 15A-15G, one or more shielding designs can be implemented and tested by a test system (e.g., 300 in FIGS. 12-14) having one or more features as described herein. Such testing can reveal how effective a given shielding design is relative to some selected threshold (e.g., −20 dBm threshold). Further, one can see that the localized field-characterization capability as described herein can allow development of RF shielding configurations that are location dependent on a given RF module. For example, some location of the RF module can be provided with more shielding, and/or another location can be provided with less shielding.

Figure 17:
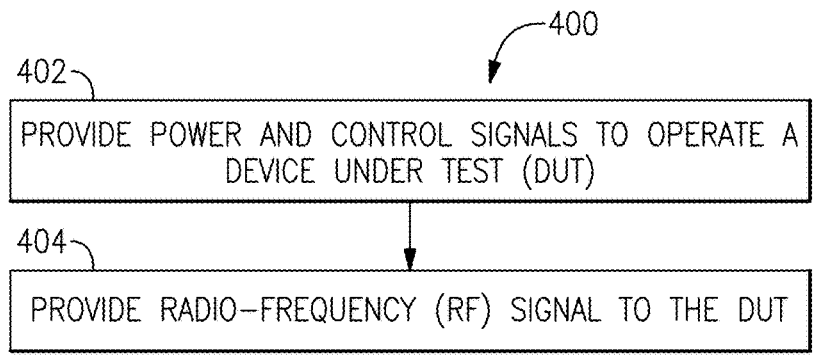
FIG. 17 shows an example process that can be performed by one or more components of the measurement system of FIG. 13.
Figure 18:
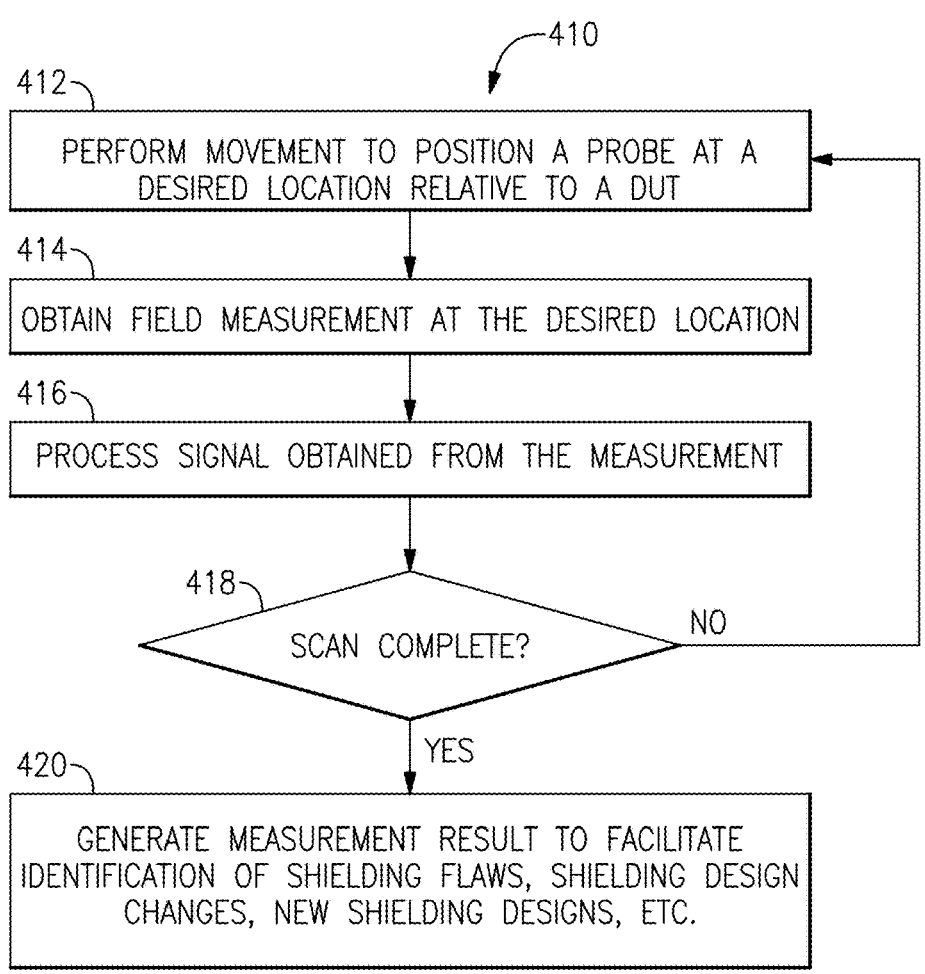
FIG. 18 shows another example process that can be performed by one or more components of the measurement system of FIG. 13.

FIGS. 17 and 18 show examples of processes that can be implemented to perform measurements as described herein. FIG. 17 shows a process 400 that can be implemented to configure a DUT for such measurements. FIG. 18 shows a process 410 that can be implemented to obtain near-field measurements so as to allow localized characterization of the DUT.

In FIG. 17, the example process 400 can include a block 402 where power and control signals are provided to allow operation of a DUT. In block 404, an RF signal can be provided to the DUT. In some implementations, an output (e.g., an amplified RF signal from a PA) of the DUT can be configured so as to provide a more realistic operating condition. For example, appropriate matching network for an output of a PA can allow the DUT to behave closer to an actual operating condition.

In FIG. 18, the example process 410 can include a block 412 where one or more movements can be performed to position a near-field probe at a desired location relative to a DUT. Such movements can be achieved by moving the probe, moving the DUT, or some combination thereof. In block 414, one or more field measurements can be obtained at the desired location. Such measurements can include magnetic field measurement, electric field measurement, or some combination thereof. In block 416, signals obtained from the one or more measurements can be processed. Such processing of signals can include, for example, pre-amplification and spectrum analysis.

In a decision block 418, the process 410 can determine whether the scan of the DUT is complete. If the answer is "No," the process 410 can loop back to block 412 for further positioning and measurements. If the answer is "Yes," the process 410 in block 420 can generate measurement results to facilitate, for example, identification of shielding flaws, shielding design changes, new shielding designs, etc.

One or more features associated with near-field probes and related measurement systems and methods as described herein can be utilized to address a number of challenges in RF applications. For example, as RF device count increases with circuit board sizes becoming smaller, EM emissions and/or interferences can have negative impact on performance at a component level, as well as at a system level. In another example, radiated emission can be more severe as frequency goes higher; thus, accurate detection of such emissions can provide important design guidelines. In yet another example, localized field measurements can troubleshoot crosstalk and/or undesired interference among parts of or between RF circuits. In yet another example, localized near-field characterization of a DUT can significantly save time and resources when compared to far-field techniques where time and resource consuming iterations (and in some situations, trial-and-error) may be required.

As described herein, one or more features described herein can allow designers to readily identify potential coupling and/or EM interference issues at an early stage. Further, design process can be guided by principles and concepts obtained from such EM characterization.

In some implementations, an EM probe having one or more features as described herein can be an effective tool for obtaining accurate EM-related diagnosis to identify or narrow down the possible sources of EM interference at a very specific location of a DUT. In some implementations, such a specific location can allow identification of an individual pin of an IC as the offending EM interference source. Based on such identification, the underlying problem can be solved, or if such a solution is not practical, appropriate shielding can be provided.

A miniaturized probe having one or more features described herein can be suitable, and in some situations crucial, for characterizing EM emissions associated with smaller modules or even some die-level devices. As described herein, such a probe can be configured as a magnetic field probe with a small sensing loop dimension. Aside from the spatial resolution, such a small probe can provide improved response for higher frequency emissions. By way of an example, EM emissions in a range of approximately 3 to 12 GHz can be sensed effectively by such a small probe.

In the context of the magnetic field probes as described herein, such probes can be configured to be highly sensitive to magnetic fields. Such probes can also be configured to deliver highly repeatable performance.

Although various probes (e.g., electric field probe and magnetic field probe) are described herein in the context of sensing fields, it will be understood that such devices can be utilized in reverse. For example, such probes can be driven (instead of sensing) by appropriate signals to generate desirable fields to very localized areas or volumes. Such a field can be injected to a localized area or volume to, for example, analyze effects of the field on specific components without subjecting other components with the same field.

For the purpose of description, it will be understood that "near-field" can include, for example, a region that extends from an EM emission source by a length less than or equal to a wavelength associated with the EM emission. Near-field as described herein can also include such a length that is less than or equal to, for example, 1 m, 30 cm, 10 cm, 1 cm, 3 mm, 1 mm, 500 μm, 100 μm, 50 μm, or 10 μm. For the purpose of description, it will be understood that a "localized region" can have an area that is less than the overall lateral area of a DUT by a factor of at least 2, 5, 10, 16, or 48.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A probe for sensing an electromagnetic (EM) field proximate to a radio-frequency (RF) device, the probe comprising:
    a coaxial assembly having a proximal end and a distal end, the coaxial assembly including an inner conductor and an outer conductive shield between the proximal and distal ends; and
    a sensing element implemented at the distal end of the coaxial assembly, the sensing element configured to sense an electrical component of a field strength of the EM field when the sensing element is configured to generate opposite differential-mode currents flowing in the inner conductor and the outer conductive shield when an electric field acts on at least a portion of the sensing element, and the sensing element configured to sense a magnetic component of the field strength of the EM field when the sensing element is configured to detect a common mode current from a change in magnetic field flux through at least a portion of the sensing element.

2. The probe of claim 1 further comprising a coaxial connector implemented at the proximal end of the coaxial assembly.

3. The probe of claim 1 wherein the outer conductive shield is connected to a ground during measurements.

4. The probe of claim 1 wherein the sensing element includes a loop having a first end connected to a distal end of the inner conductor and a second end connected to a distal end of the outer conductive shield, the loop configured so that a change in magnetic field flux through the loop induces a detectable common mode current.

5. The probe of claim 4 wherein the loop has a circular shape.

6. The probe of claim 5 wherein the circular loop has a diameter that is 1 mm or less.

7. The probe of claim 1 wherein the coaxial assembly has a characteristic impedance of approximately 50 ohms.

8. The probe of claim 1 wherein the field strength includes a near-field strength associated with the EM field strength present at a separation distance from a surface of the RF device.

9. The probe of claim 8 wherein the separation distance is approximately 1 mm or less.

10. A method for testing a radio-frequency (RF) device, the method comprising:
    operating the RF device to generate an electromagnetic (EM) emission;
    positioning a coaxial assembly having a sensing element relative to the RF device to allow a measurement of the EM emission, the coaxial assembly having a proximal end and a distal end, the coaxial assembly including an inner conductor and an outer conductive shield between the proximal and distal ends, the sensing element configured to sense an electrical component of a field strength of the EM emission when the sensing element is configured to generate opposite differential-mode currents flowing in the inner conductor and the outer conductive shield when an electric field acts on at least a portion of the sensing element, and the sensing element configured to sense a magnetic component of the field strength of the EM emission when the sensing element is configured to detect a common mode current from a change in magnetic field flux through at least a portion of the sensing element; and
    measuring the field strength of the electrical component or the magnetic component through the positioned sensing element.

11. The method of claim 10 wherein the RF device is a power amplifier module.

12. The method of claim 10 wherein the measured field strength is representative of a field distribution over a selected area that is smaller than an overall lateral area of the RF device, the selected area being less than the overall lateral area by a factor of at least 10.

13. The method of claim 10 wherein the measured field strength is representative of a field distribution over a selected area that is smaller than an overall lateral area of the RF device, the selected area being less than or equal to approximately 1 mm$^2$.

14. The method of claim 10 wherein the measured field strength includes a near-field strength associated with the EM field strength present at a separation distance from a surface of the RF device, the separation distance being approximately 1 mm or less.

15. A system for testing a radio-frequency (RF) device, the system comprising:
    a control system configured to allow operation of the RF device;
    a signal generator configured to provide an RF signal to the RF device so that the operating RF device generates an electromagnetic (EM) emission; and
    a measurement system that includes a probe configured to measure a field strength representative of a field distribution, the probe including a sensing element and a coaxial assembly having a proximal end and a distal end, the coaxial assembly including an inner conductor and an outer conductive shield between the proximal and distal ends, the sensing element configured to sense an electrical component of a field strength of the EM field when the sensing element is configured to generate opposite differential-mode currents flowing in the inner conductor and the outer conductive shield when an electric field acts on at least a portion of the sensing element, and the sensing element configured to sense a magnetic component of the field strength of the EM field when the sensing element is configured to detect a common mode current from a change in magnetic field flux through at least a portion of the sensing element.

16. The system of claim 15 wherein the RF device is a power amplifier module.

17. The system of claim 15 wherein the measured field strength is representative of a field distribution over a selected area that is smaller than an overall lateral area of the RF device, the selected area being less than the overall lateral area by a factor of at least 10.

18. The system of claim 15 wherein the measured field strength is representative of a field distribution over a selected area that is smaller than an overall lateral area of the RF device, the selected area being less than or equal to approximately 1 mm².

19. The system of claim 15 wherein the measured field strength includes a near-field strength associated with the EM field strength present at a separation distance from a surface of the RF device, the separation distance being approximately 1 mm or less.

20. The system of claim 15 wherein the probe comprises a coaxial connector implemented at the proximal end of the coaxial assembly.

\* \* \* \* \*